United States Patent
Kim et al.

(10) Patent No.: US 8,778,083 B2
(45) Date of Patent: Jul. 15, 2014

(54) LATERAL-FLOW DEPOSITION APPARATUS AND METHOD OF DEPOSITING FILM BY USING THE APPARATUS

(75) Inventors: Ki Jong Kim, Daejeon-si (KR); Yong Min Yoo, Cheonan-si (KR); Jung Soo Kim, Cheonan-si (KR); Hyung Sang Park, Seoul (KR); Seung Woo Choi, Cheonan-si (KR); Jeong Ho Lee, Seoul (KR); Dong Rak Jung, Cheonan-si (KR)

(73) Assignee: ASM Genitech Korea Ltd., Cheonan-Si (KR)

( * ) Notice: Subject to any disclaimer, the term of this patent is extended or adjusted under 35 U.S.C. 154(b) by 844 days.

(21) Appl. No.: 12/841,139

(22) Filed: Jul. 21, 2010

(65) Prior Publication Data

US 2011/0020545 A1 Jan. 27, 2011

(30) Foreign Application Priority Data

Jul. 22, 2009 (KR) .................. 10-2009-0067047

(51) Int. Cl.
  *C23C 16/00* (2006.01)
  *C23C 16/46* (2006.01)
  *C23C 16/455* (2006.01)
  *C23C 16/458* (2006.01)

(52) U.S. Cl.
  CPC ......... *C23C 16/45544* (2013.01); *C23C 16/466* (2013.01); *C23C 16/45504* (2013.01); *C23C 16/4584* (2013.01)
  USPC ............ 118/730; 118/725; 118/733; 118/724

(58) Field of Classification Search
  USPC ............... 156/914, 345.51–345.55; 118/725, 118/728–731, 733
  See application file for complete search history.

(56) References Cited

U.S. PATENT DOCUMENTS

| | | | | |
|---|---|---|---|---|
| 5,370,739 A | * | 12/1994 | Foster et al. | 118/725 |
| 5,478,401 A | * | 12/1995 | Tsunekawa et al. | 134/1 |
| 5,683,518 A | * | 11/1997 | Moore et al. | 118/730 |
| 5,711,811 A | | 1/1998 | Suntola et al. | |
| 5,891,251 A | * | 4/1999 | MacLeish et al. | 118/719 |
| 6,156,125 A | * | 12/2000 | Harada | 118/715 |
| 6,419,751 B1 | * | 7/2002 | Nagashima | 118/715 |
| 6,539,891 B1 | | 4/2003 | Lee et al. | |
| 6,562,140 B1 | | 5/2003 | Bondestam et al. | |
| 6,610,180 B2 | * | 8/2003 | Sakai et al. | 204/192.12 |
| 6,645,574 B1 | | 11/2003 | Lee et al. | |
| 6,969,829 B2 | * | 11/2005 | Tsuruno et al. | 219/390 |
| 2003/0143328 A1 | * | 7/2003 | Chen et al. | 118/715 |
| 2005/0229849 A1 | * | 10/2005 | Silvetti et al. | 118/715 |
| 2006/0249077 A1 | | 11/2006 | Kim et al. | |

FOREIGN PATENT DOCUMENTS

| KR | 10-0273473 | 9/2000 |
|---|---|---|
| KR | 10-0624030 | 9/2006 |
| KR | 10-2008-0005970 | 1/2008 |

* cited by examiner

*Primary Examiner* — Gordon R Baldwin
*Assistant Examiner* — Charlee Bennett
(74) *Attorney, Agent, or Firm* — Lexyoume IP Meister, PLLC (57) ABSTRACT

A deposition apparatus according to an exemplary embodiment of the present invention is a lateral-flow deposition apparatus in which a process gas flows between a surface where a substrate is disposed and the opposite surface, substantially in parallel with the substrate. The lateral-flow deposition apparatus includes: a substrate support that moves up/down and rotates the substrate while supporting the substrate; a reactor cover that defines a reaction chamber by contacting the substrate support; and a substrate support lifter and a substrate support rotator that move the substrate support.

13 Claims, 14 Drawing Sheets

2/4 turn

FIG.3D

3/4 turn

FIG.3E

LATERAL-FLOW DEPOSITION APPARATUS AND METHOD OF DEPOSITING FILM BY USING THE APPARATUS

CROSS-REFERENCE TO RELATED APPLICATION

This application claims priority to and the benefit of Korean Patent Application No. 10-2009-0067047 filed in the Korean Intellectual Property Office on Jul. 22, 2009, the entire contents of which are incorporated herein by reference.

BACKGROUND OF THE INVENTION (a) Field of the Invention

The present invention relates to a lateral-flow deposition apparatus and a method of depositing film by using the apparatus.

(b) Description of the Related Art

A study for improving processes of apparatuses forming a high-quality film on a substrate in manufacturing semiconductor device has been conducted. Recently, an atomic layer deposition (ALD) has been proposed, which enables to form a thin film on a substrate by using surface reaction of two or more reaction gases that are sequentially supplied on a substrate at different time, and forms a thin film having a desired thickness by repeating this sequence. Since the film is formed by the surface reaction, according to this process, it is possible to achieve a film having a uniform thickness throughout the surface of the substrate, regardless of protrusions and depressions of the substrate, and form a film having excellent properties by reducing impurities contained in the film.

According to the atomic layer deposition, reaction gasses are sequentially supplied into a reactor in the order of a first reaction gas→an inert purge gas→a second reaction gas→an inert purge such that the reaction gases do not meet or react in a gas state in a reaction chamber, by using respective valves for each gas. This sequence is called 'cycle'. Some of the reaction gases may be activated by plasma. Plasma atomic layer deposition that intermittently provides plasma in a reactor in synchronization with the sequential gas supply cycle has been disclosed in Korea Patent No. 273473 and U.S. Pat. No. 6,645,574.

In the atomic layer deposition apparatus used for atomic layer deposition, the gases flow fast and simply in parallel with a substrate in the reactor, so the lateral-flow atomic layer deposition reactor can lead to fast gas switching and minimize time for supplying sequentially the gases in a cycle As an example of the lateral-flow reactor, a reactor suitable for time-division gas supply atomic deposition and a method of depositing a thin film in the reactor has been disclosed in Korea Patent No. 624030 and U.S. Pat. No. 6,539,891. Further, a modified example has been disclosed in Korea Patent Application No. 2005-0038606 and U.S. patent application Ser. No. 11/429,533. According to this reactor, it is possible to perform plasma atomic layer deposition by supplying plasma power to an electrode, which supplies radio frequency (RF) power, in synchronization with the gas supply cycle.

Other examples of the lateral-flow atomic layer reactor have been disclosed in U.S. Pat. No. 5,711,811 and U.S. Pat. No. 6,562,140. In these inventions, the gas flow is maintained uniformly and close to laminar flow on a substrate by maintaining the gap between a surface where the substrate is placed and the surface opposite to the substrate in the reactors.

It is possible to form a completely uniform film, if atomic layers are formed layer by layer on the substrate; however, practically, non-uniformity of about 3% usually exists in the film formed by the atomic layer deposition, because of various reasons, particularly, because it is required to increase the deposition rate and productivity of the equipment by reducing the time for supplying gases in a cycle.

When the lateral-flow deposition reactor is used, the non-uniformity is generated usually in the gas flow direction. Further, the thickness of a thin film deposited in the lateral-flow deposition apparatus is larger usually at the gas inlet than the gas outlet, because the concentration of the gas is generally high at the gas inlet than at the gas outlet.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a lateral-flow deposition apparatus and a lateral-flow deposition method having advantages of improving uniformity of a thin film formed on a substrate.

An exemplary embodiment of the present invention provides a deposition apparatus, which is a lateral-flow deposition apparatus in which a process gas flows between a surface where a substrate is disposed and the opposite surface, substantially in parallel with the substrate. The lateral-flow deposition apparatus includes: a substrate support that moves up/down and rotates the substrate while supporting the substrate; a reactor cover that defines a reaction chamber by contacting the substrate support; and a substrate support lifter and a substrate support rotator that move the substrate support.

The lateral-flow deposition apparatus may further includes a substrate support heater disposed under the substrate support, transferring heat to the substrate support, and moving up/down.

The substrate support heater and the substrate support may be spaced at a distance from each other.

The lateral-flow deposition apparatus may further include a sub-gas inlet allowing a sub-gas to be injected between the substrate support and the substrate support heater.

Heat of the substrate support heater may be transferred to the substrate support by the sub-gas.

The sub-gas may flow to prevent the process gas from flowing under the substrate support.

The lateral-flow deposition apparatus may further include: a substrate support pin supporting the substrate independently from the substrate support and moving up/down; and a support pin driver moving up/down the substrate support pin.

The lateral-flow deposition apparatus may further include a support pin base connecting the support pin driver with the support pin.

The substrate support rotator may rotate the substrate support while the process gas flows on the substrate.

The substrate support rotator may rotate the substrate support by n°, and the rotation of the substrate support is performed at least)(360°/n°) time.

The reactor cover may define a reaction chamber by contacting the substrate support, when the substrate support rotates.

Another embodiment of the present invention provides a method of lateral-flow deposition in which a process gas flows between a surface where a substrate is placed and the opposite surface substantially in parallel with the substrate. The method includes: depositing a portion of a desired thickness on the substrate by supplying a process gas in a predetermined direction; changing the flow direction of the process gas with respect to the center of the substrate by rotating the substrate with a portion of the desired thickness deposited; and depositing a portion of the desired thickness on the substrate where the process gas flow is changed, in which the rotation of the substrate is performed with the reaction space in which the process gas flows defined on the substrate.

A portion of the desired thickness may be 1/m (m is a natural number of 2 or more) of the desired thickness.

The substrate may be rotated by about 360/m° relatively to the flow direction of the process gas.

The substrate may be repeatedly rotated at least m times.

According to a lateral-flow deposition apparatus and a method thereof of an exemplary embodiment of the present invention, the substrate is rotated during the thin film deposition process, the flow direction of the process gas is changed with respect to the center of the substrate by rotating the substrate on which a portion of a desired thickness is deposited. Accordingly, it is possible to achieve a thin film having improved uniformity by repeating this work. Further, it is possible to simply and rapidly rotate the substrate and deposit a thin film, as compared with deposition apparatuses that separately perform a film deposition process and a substrate rotation process, thereby reducing the entire process time, by rotating the substrate in the deposition process. Further, since the substrate is rotated with the reaction chamber blocked from the outside, it is possible to prevent foreign substances from flowing into the reaction chamber, as compared with deposition apparatuses that separately perform a film deposition process and a substrate rotation process, thereby improving the quality of the deposited thin film.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
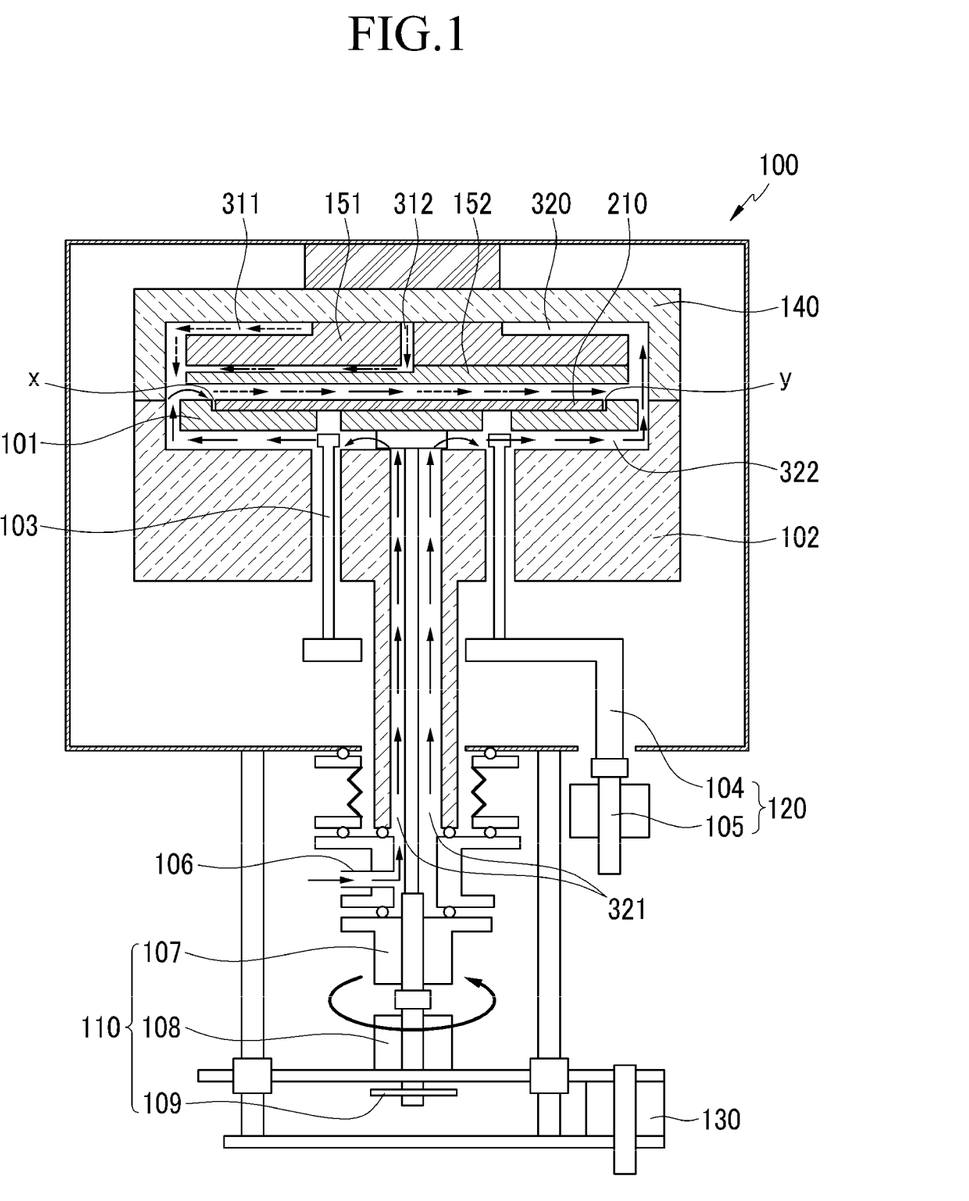
FIG. 1 is a cross-sectional view schematically showing a lateral-flow atomic layer deposition apparatus according to an exemplary embodiment of the present invention.

Hereinafter, a lateral-flow deposition apparatus according to an exemplary embodiment of the present invention is described with reference to FIG. 1. FIG. 1 is a cross-sectional view schematically showing a lateral-flow atomic layer deposition apparatus according to an exemplary embodiment of the present invention.

Referring to FIG. 1, a deposition apparatus 100 according to an exemplary embodiment of the present invention includes a substrate support 101 rotatably supporting a substrate 210, a substrate support heater 102 heating the substrate support 101, a substrate support pin 103, sub-gas inlet 106, a substrate support driver 110, a substrate support pin driver 120, a substrate support heater lifter 130, and a reactor cover 140 defining a reaction chamber by contacting the substrate support heater 102. Further, the deposition apparatus 100 according to an exemplary embodiment of the present invention further include gas flow channels 311, 312 connected with the reactor cover 140 and allows a process gas to flow inside and moving inside the reaction chamber, and a gas discharge channel 320 for discharging the gas. Further, the deposition apparatus 100 further includes a sub-gas inflow channel 321 allowing a sub-gas flowing inside through the sub-gas inlet 106 to flow into the reaction chamber and a sub-gas flow channel 322 allowing the sub-gas flowing in the reaction chamber to move inside the reaction chamber. The flow direction of each gas is indicated by arrows in FIG. 1.

The substrate support driver 110 includes a substrate support lifter 107 moving up/down the substrate support 101, a substrate support rotator 108 rotating the substrate support 101, and a rotational reference plate 109 defining the reference position of the substrate support 101.

The substrate support pin driver 120 includes a support pin base 104 for moving up/down the substrate support pin 103 and a support pin lifter 105 connected with the support pin base 104.

Structures 151, 152 inducing gas flow are disposed in the reaction chamber in order to allow the gas to flow on and in parallel with the substrate and maintain the gas flow in substantially laminar flow in the reaction chamber. The position 'x' corresponds to the inflow portion of the lateral-flow gas and the position 'y' corresponds to the outflow portion of the lateral-flow gas, on the substrate 210.

Hereinafter, the operation of the deposition apparatus 100 according to an exemplary embodiment of the present invention is described with reference to FIG. 2A to FIG. 2J. FIG. 2A to FIG. 2J are cross-sectional views sequentially showing a deposition apparatus according to an exemplary embodiment of the present invention, before and after a deposition process.

Figure 2A:
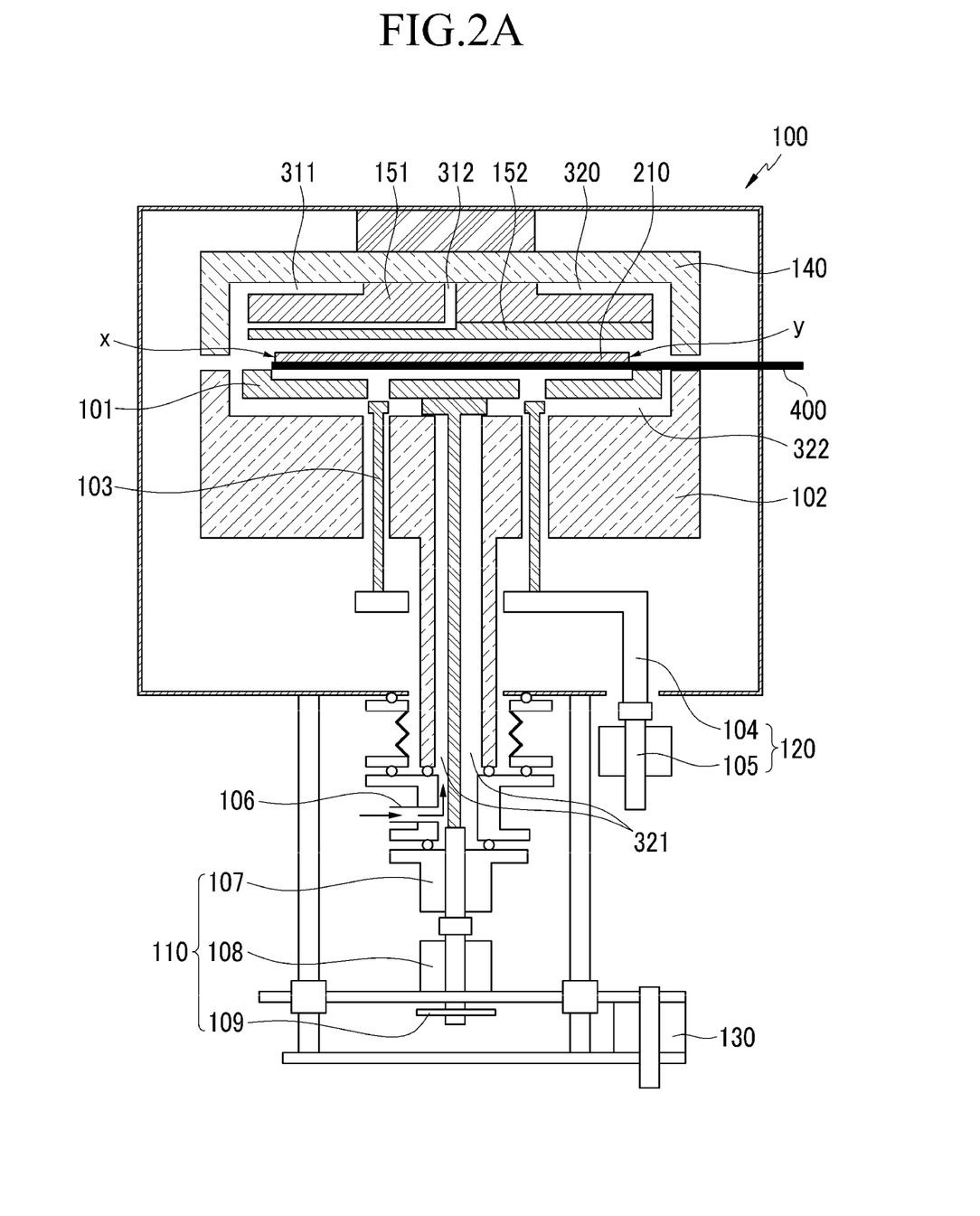
FIG. 2A to FIG. 2J are cross-sectional views sequentially showing a deposition apparatus according to an exemplary embodiment of the present invention, before and after a deposition process.

Before a deposition process, as shown in FIG. 2A, the substrate support 101, the substrate support heater 102, and the substrate support pin 103 are down with the reaction chamber open by the substrate support lifter 107, the substrate support heater lifter 130, and the support pin lifter 105, and the substrate 210 is mounted on a substrate transfer 400, such as a robot arm, which is disposed outside the reactor, and inserted in the reactor.

Figure 2B:
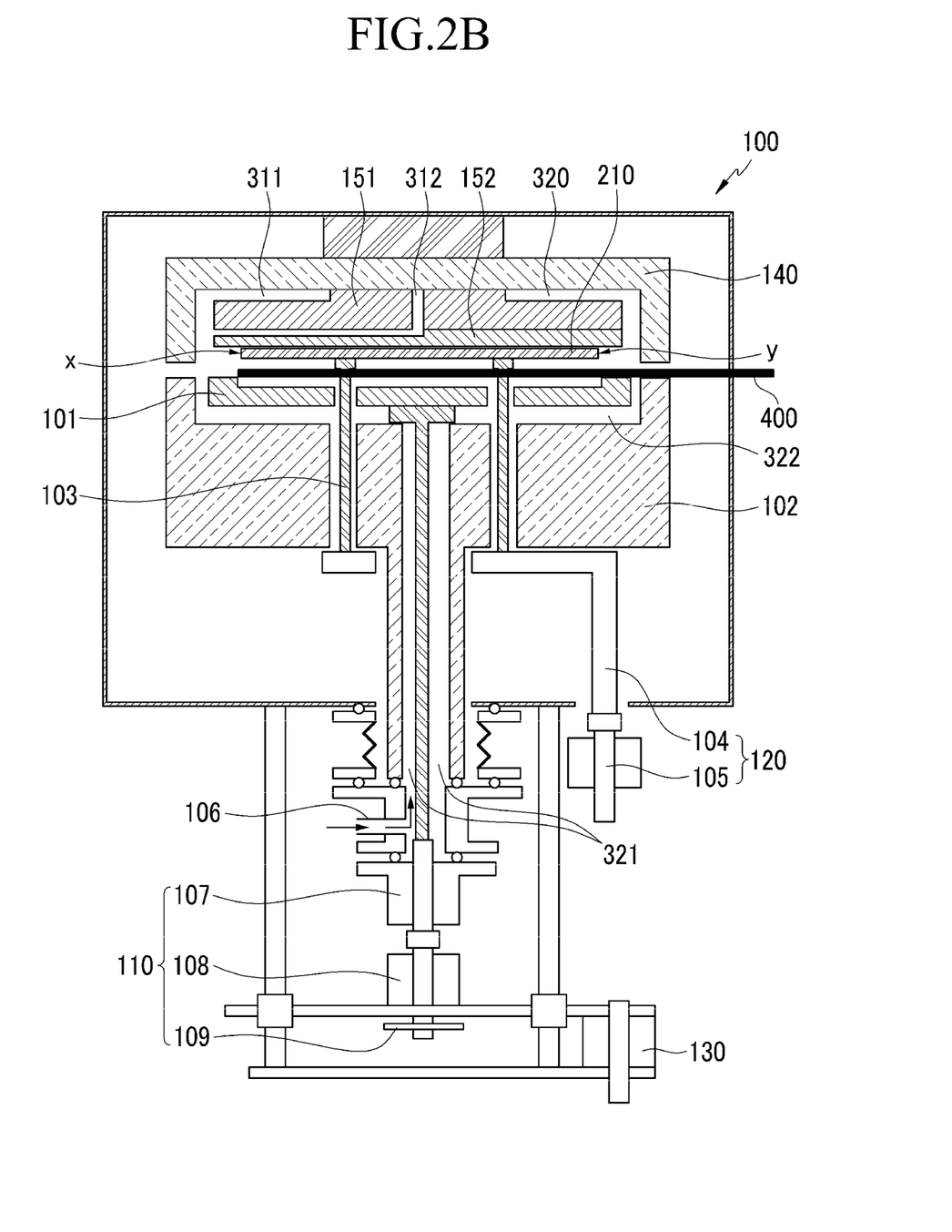
Figure 2C:
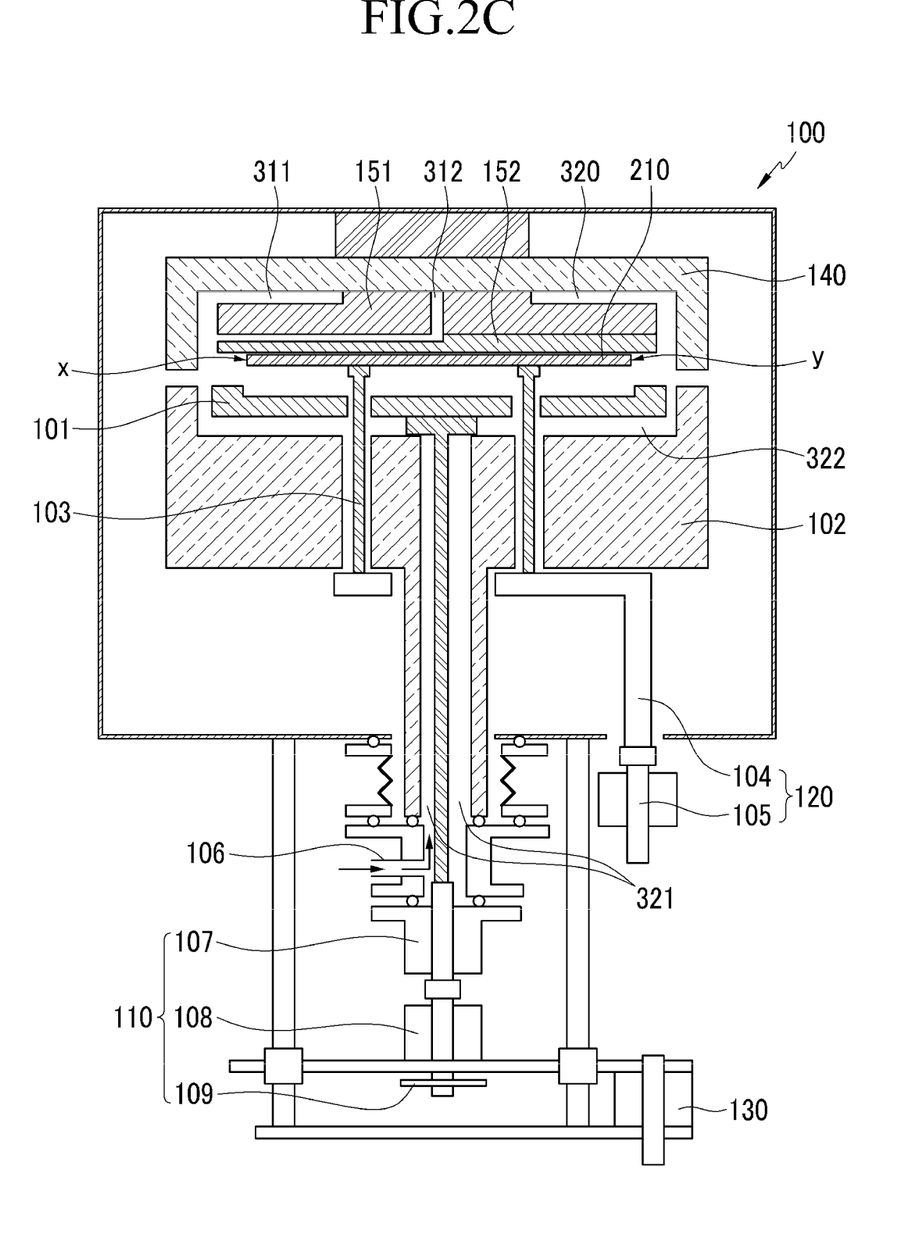

Thereafter, as shown in FIG. 2B, as the support pin lifter 105 moves up the support pin base 104, the substrate support pin 103 moves up to support the substrate 210 on the substrate transfer 400, and as shown in FIG. 2C, the substrate transfer 400 moves outside of the reactor while the substrate support pin 103 supports the substrate 210.

Figure 2D:
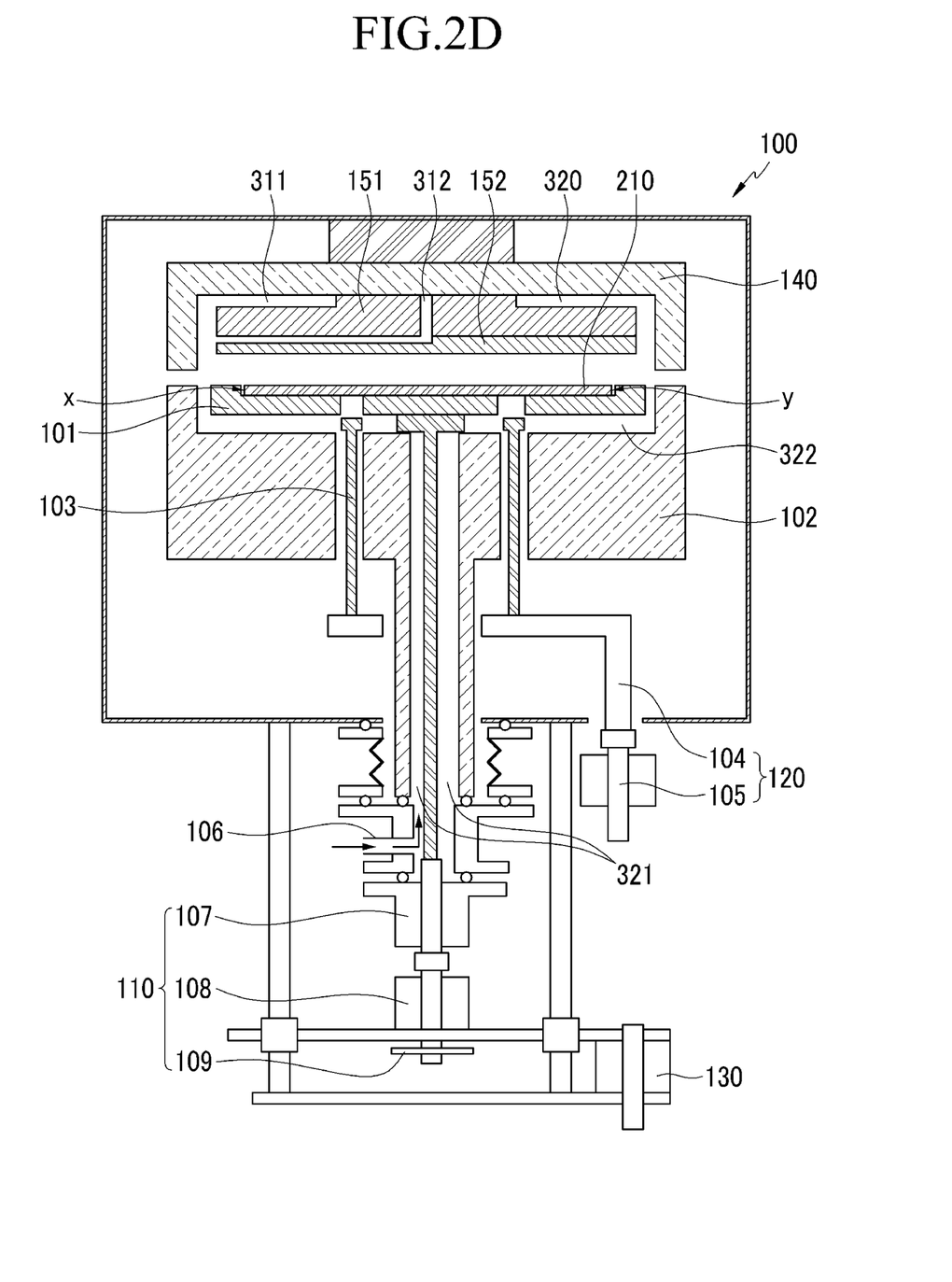

Next, as shown in FIG. 2D, as the support pin lifter 105 moves downs, the support pin base 104 moves down, and the substrate support pin 103 and the substrate 210 move down, such that the substrate 210 is placed on the substrate support 101. A shown in the figures, the substrate support 101 of the deposition apparatus according to an exemplary embodiment of the present invention is disposed at a predetermined distance from the substrate support heater 102.

Figure 2E:
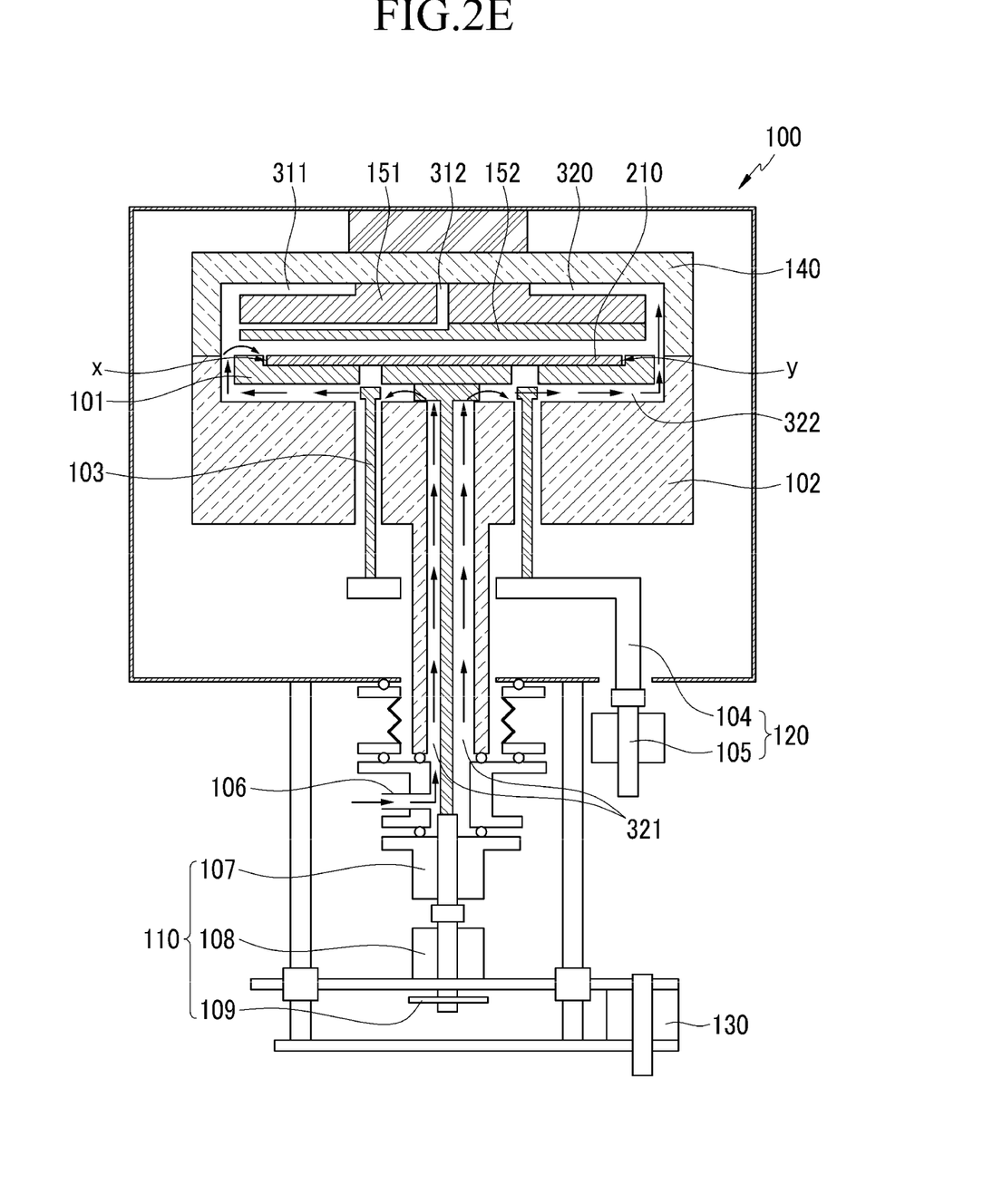

Next, as shown in FIG. 2E, the substrate support 101 and the substrate support heart 102 are moved up to define the reaction chamber by the substrate support lifter 107 and the substrate support heater lifter 130, and the substrate support heater 102 heats the substrate support 101 and the substrate 210 up to desired temperature. In this operation, sub-gas flows inside through the sub-gas inlet 106, and continues flowing to the substrate support 101 and the substrate support heater 102 through the sub-gas inflow channel 321 and the sub-gas flow channel 322. The sub-gas is an inert gas. The sub-gas functions as a heat transfer medium between the substrate support heater 102 and the substrate support 101, which are spaced apart from each other, and in detail, the sub-gas is heated by the substrate support heater 102 and flows under the substrate support 101 such that the heat is more efficiently transferred from the spaced substrate support heater 102 to the substrate support 101.

Figure 2F:
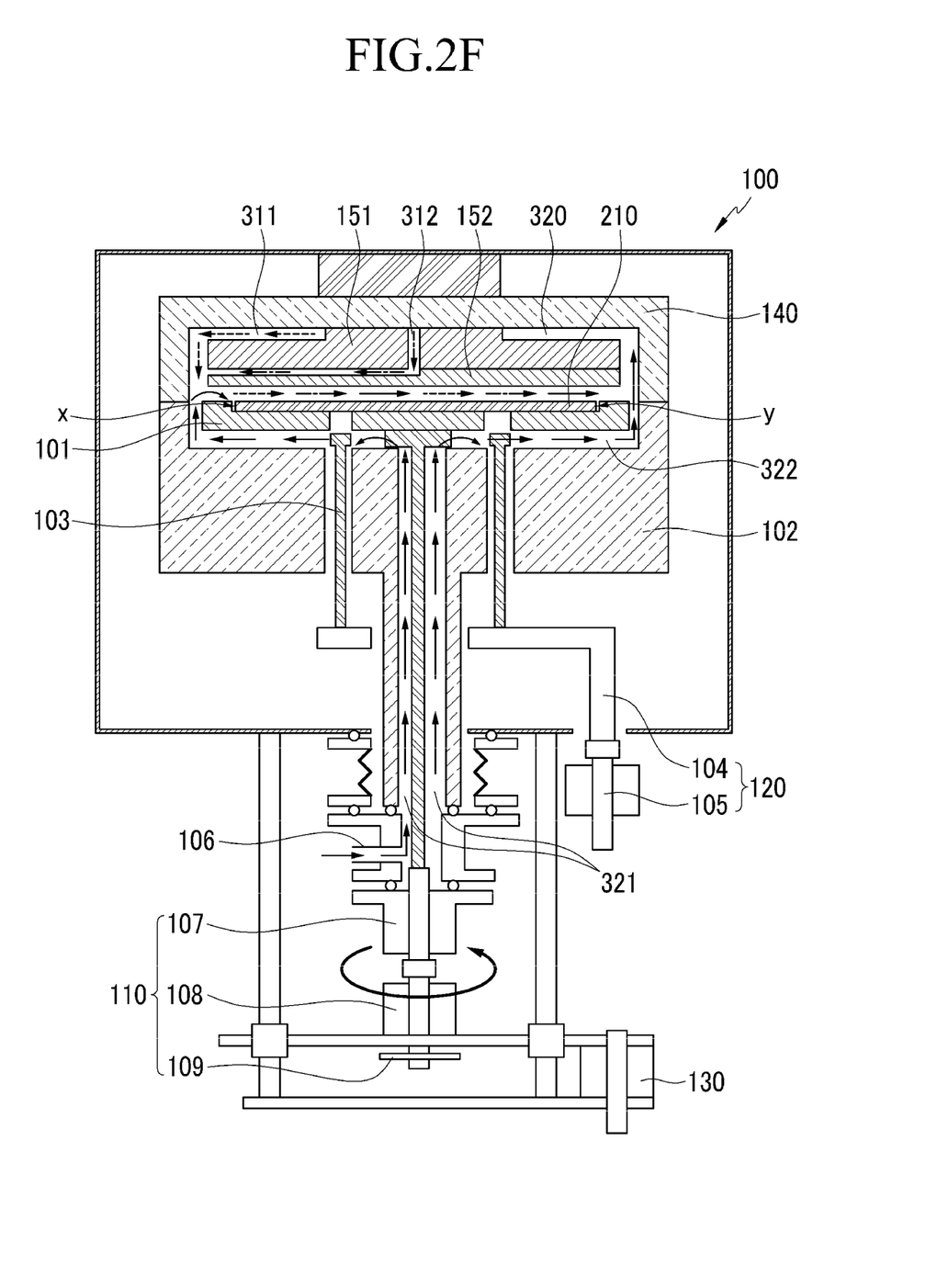

Next, as shown in FIG. 2F, a process gas flows inside and continues flowing on the substrate 210 through the process gas flow channels 311, 312 and the sub-gas flows inside through the sub-gas inlet 106 and continues flowing between the substrate support 101 and the substrate support heater 102 through the sub-gas inflow channel 321 and the sub-gas flow channel 322, such that a thin film is deposited on the substrate 210 by reaction of the process gas. In the process, the process gas flows from the gas inlet portion 'x' to the gas outlet portion 'y' on the substrate 210 substantially in parallel with the surface of the substrate 210, while maintaining substantially laminar flow. Since the sub-gas flows under the substrate support 101 to the reactor, the process gas flowing through the process gas flow channel 311, 312 is prevented from flowing under the substrate support 101, such that it is possible to prevent a thin film from being deposited at undesired positions, such as the rear side of the substrate 210 or the rear side of the substrate support 101.

Figure 2G:
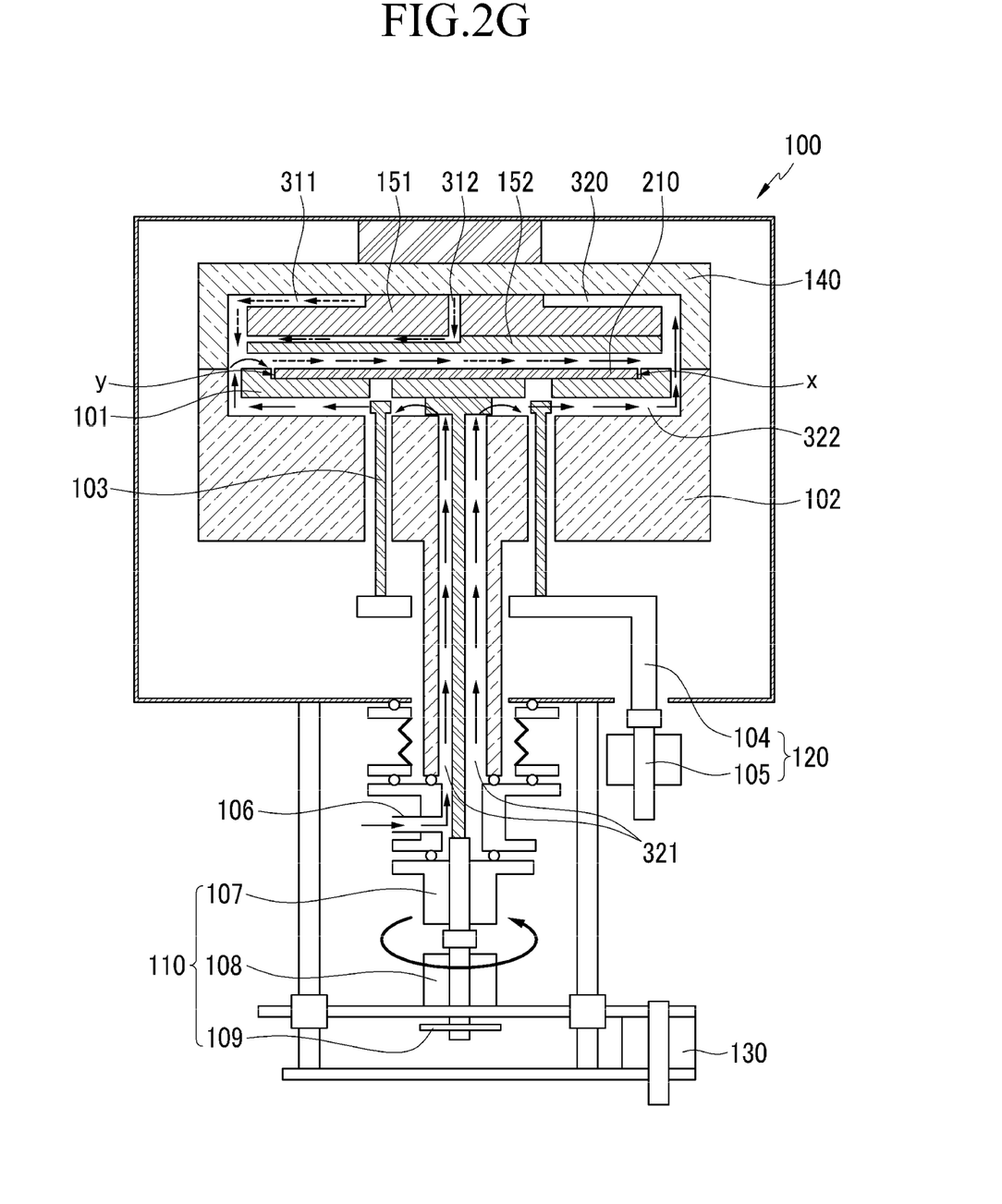

As shown in FIG. 2G, while the process gas flows inside and a thin film is deposited on the substrate 210, the substrate support 101 is rotated by the substrate support rotator 108 and the substrate 210 on the substrate support 101 is correspondingly rotated, such that the gas inflow portion 'x' is arranged to the gas outlet and the gas outflow portion 'y' is arranged to the gas inlet.

Therefore, it is possible to reduce changes in flow rate or concentration of the process gas depending on the positions on the substrate 210, such that it is possible to improve uniformity of the thin film deposited on the substrate 210.

Although the present exemplary embodiment exemplifies when the substrate is rotated about at 180° by the rotation of the substrate support 101, the rotation of the substrate support 101 can by controlled to desired angles and the number of rotation can also be controlled to desired levels. For example, when the substrate support 101 rotates n°, the number of rotation may be 360°/n° and the substrate 210 may rotate 360° in a horizontal plane in the step of rotation. Accordingly, the average direction of the flow of the process gas can be substantially uniform about the center of the substrate, throughout the substrate. It is possible to determine whether the substrate 210 finishes rotating 360° by determining the reference position of the rotational reference plate 109.

As described above, according to the deposition apparatus 100 of an exemplary embodiment of the present invention, during a process of thin film deposition, a portion of desired thickness is deposited on the substrate by supplying a reaction gas in a predetermined direction, the flow direction of the process gas is changed with respect to the center of the substrate by rotating the substrate support 101 and the substrate 210 deposited with a portion of the desired thickness in the lateral-flow deposition apparatus 100, and then a portion of desired thickness is deposited on the substrate on which the flow direction of the gas is changed. Accordingly, it is possible to achieve a thin film having improved uniformity by repeating this work. Further, it is possible to simply and quickly rotate the substrate and deposit the thin film by rotating the substrate 210 during the deposition process, as compared with deposition apparatuses that separately perform a film deposition process and a substrate rotation process, thereby reducing the entire process time. Further, since the substrate is rotated in the reaction chamber defined, it is possible to prevent foreign substances from flowing into the reaction chamber, as compared with deposition apparatuses that separately perform a film deposition process and a substrate rotation process, so reaction chamber is opened to rotate substrate. This invention, however, enables to rotate substrate without opening the reaction chamber, and preventing foreign substances from flowing into reactor, thereby improving the quality of the deposited thin film.

Figure 2H:
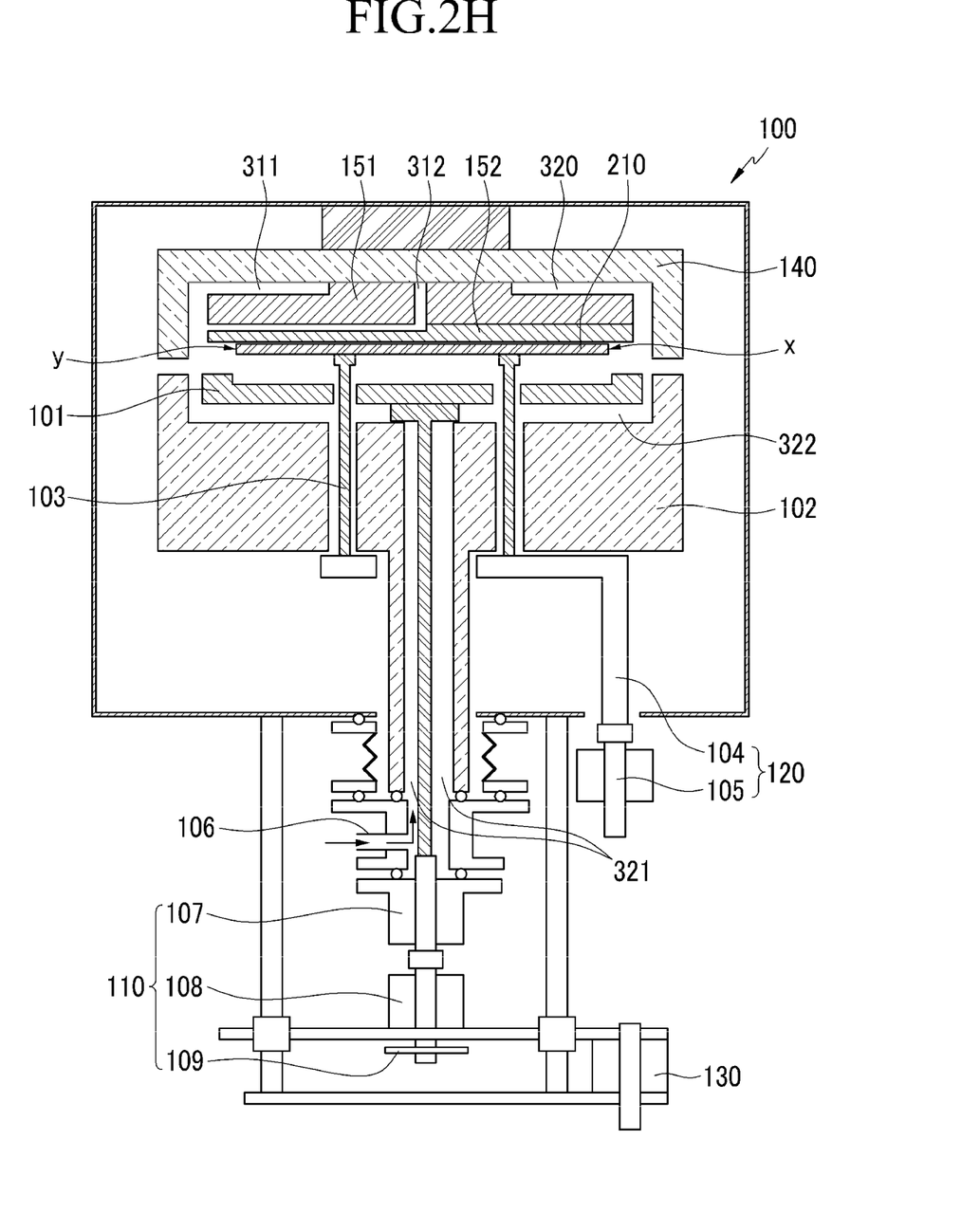

By these processes, after a thin film having a desired thickness is formed on the substrate 210, as shown in FIG. 2H, the substrate support 101 and the substrate support heater 102 are moved down by the substrate support lifter 107 and the substrate support heater lifter 130 to open the reaction chamber, and the substrate 210 is placed on the substrate support pin 103.

Figure 2I:
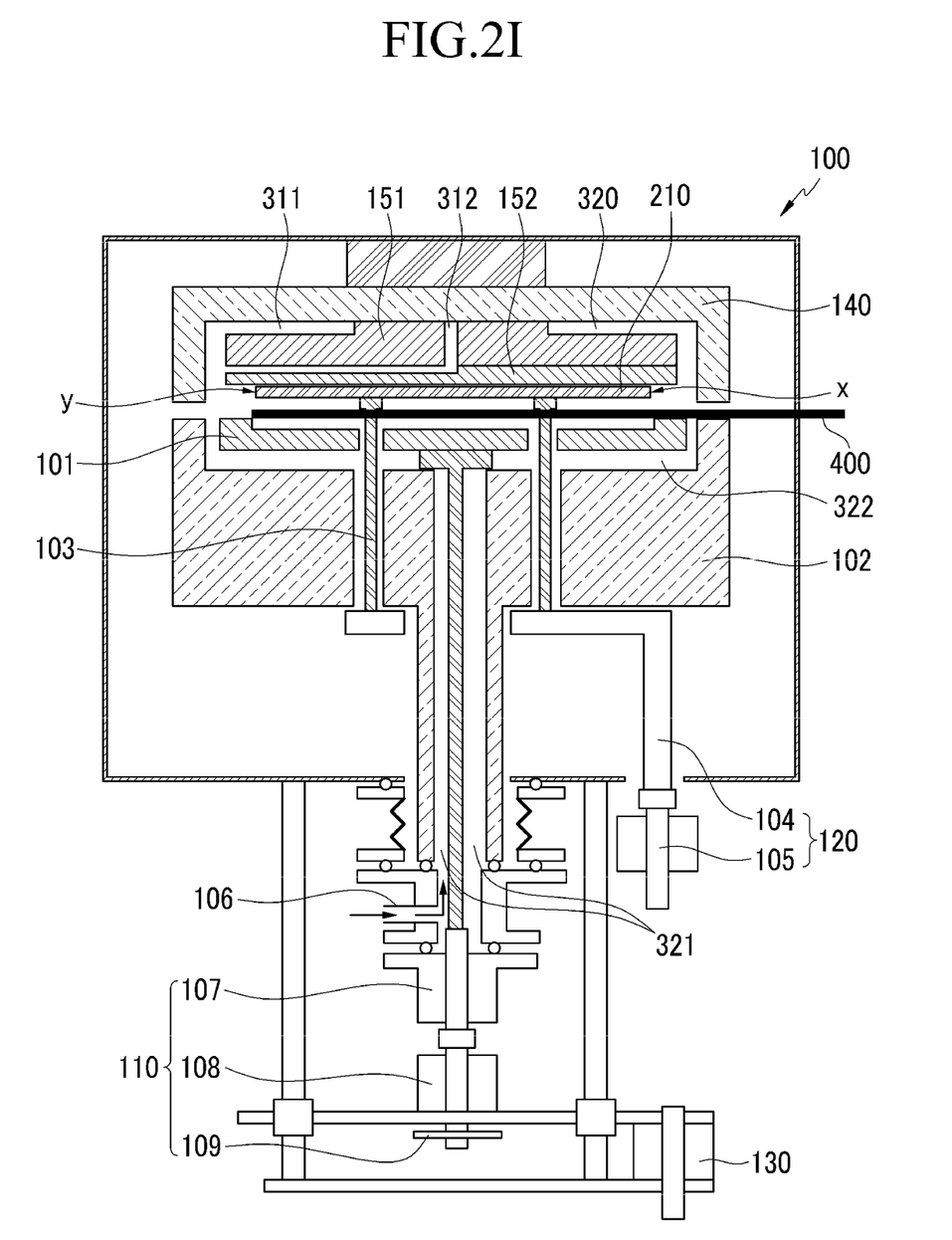
Figure 2J:
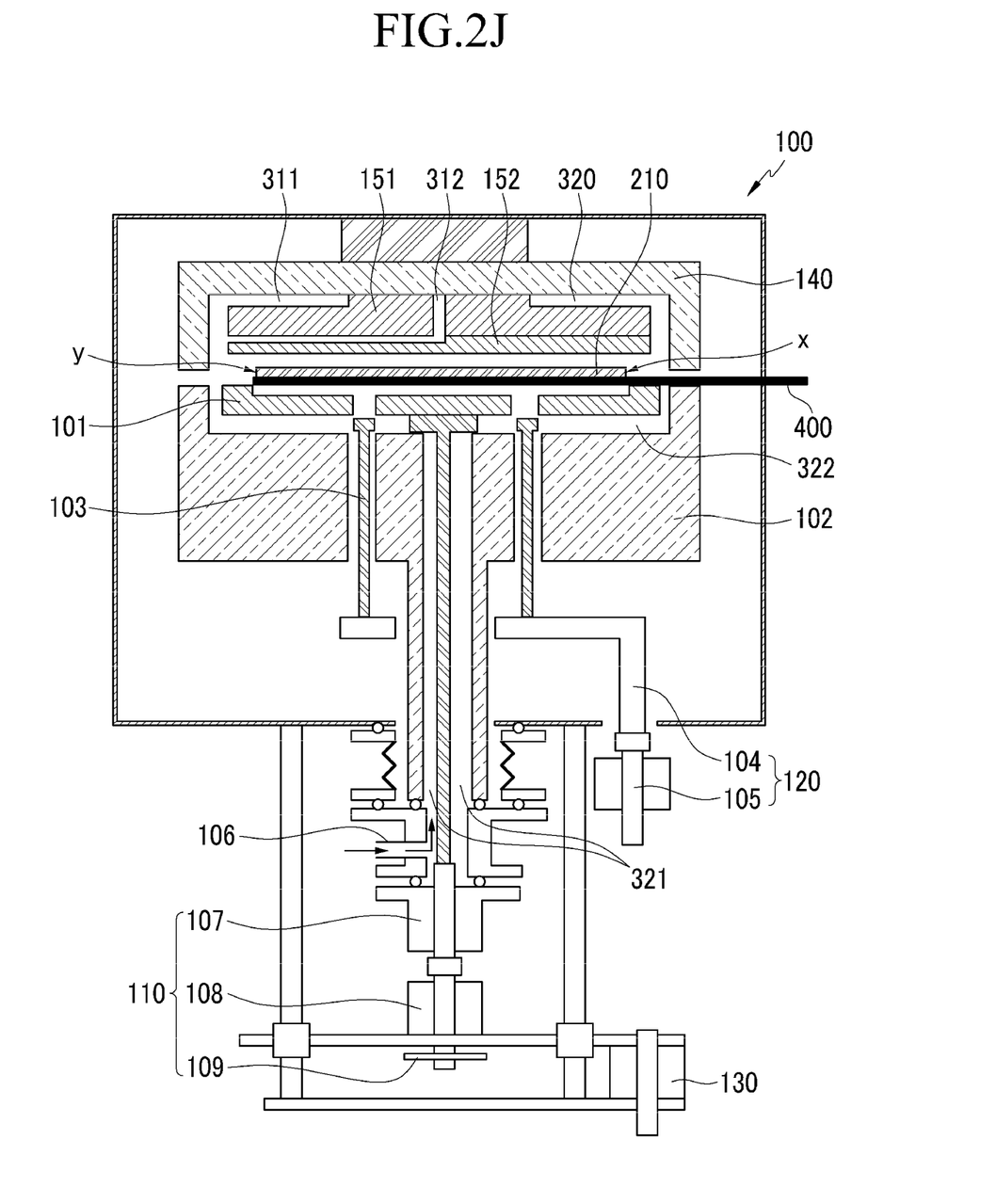

Thereafter, as shown in FIG. 2I, the substrate transfer 400 is moved into the open reaction chamber, as shown in FIG. 2J, the substrate support pin 103 is moved down by the support pin lifter 105 and the substrate 210 is placed on the substrate transfer 400, and the substrate transfer 400 is taken out of the reaction chamber and the substrate 210 that has undergone the deposition process is taken out of the reactor.

Hereafter, a deposition method using the deposition apparatus 100 according to an exemplary embodiment of the present invention is described with reference to FIG. 3A to FIG. 3D. FIG. 3A to FIG. 3D are schematic views showing gas flow with respect to positions on the surface of a substrate provided in a deposition apparatus according to an exemplary embodiment of the present invention.

Figure 3A:
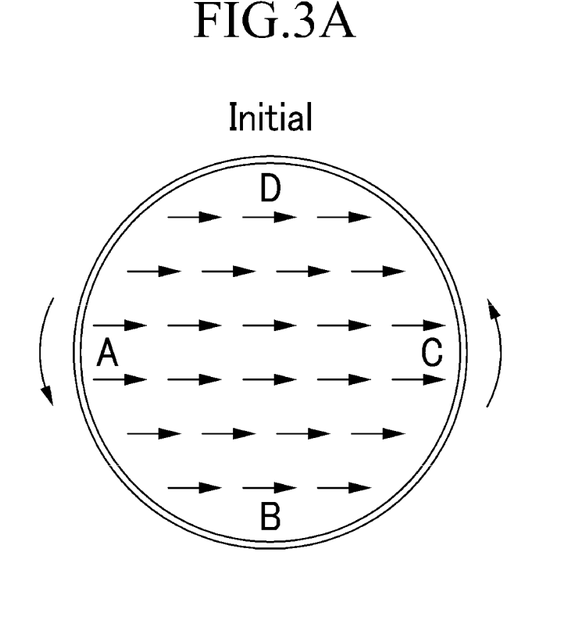
FIG. 3A to FIG. 3E are schematic views showing gas flow with respect to positions on the surface of a substrate provided in a deposition apparatus according to an exemplary embodiment of the present invention.

Referring to FIG. 3A, the position A corresponds to the process gas inflow portion and the position C corresponds to the process gas outflow portion in the substrate, in the initial state of the thin film deposition process. Therefore, the flow rate or concentration of the process gas is the highest at the position A and the lowest at the position C of the substrate, and the concentration is the middle at the position B and D in the substrate. A portion of a thin film is deposited and the substrate is rotated, at the initial concentration of the process gas. The present exemplary embodiment exemplifies when the substrate rotates at about 90° for each time. Therefore, the total rotation number is at least (360°/90°=) 4 times. Further, the thickness of the thin film deposited on the substrate for each rotation may be m/4 of the desired thickness (m).

Figure 3B:
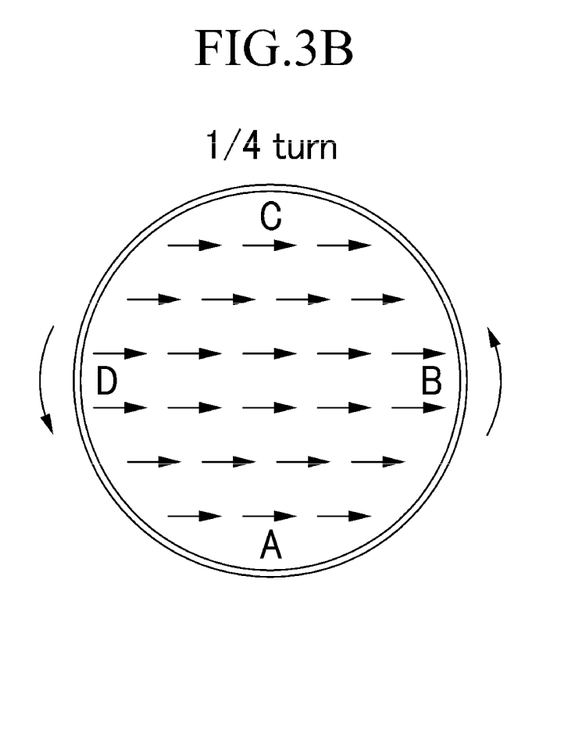

Referring to FIG. 3B, when the substrate is rotated one time, the position D corresponds to the process gas inflow portion and the position B corresponds to the process gas outflow portion in the substrate. Therefore, the flow rate or concentration of the process gas is the highest at the position D, the lowest at the position B of the substrate, and the middle at the positions A and C in the substrate. A portion (m/4 of the desired thickness 'm') of the thin film is deposited and the substrate is rotated at the initial flow rate and concentration of the process gas.

Figure 3C:
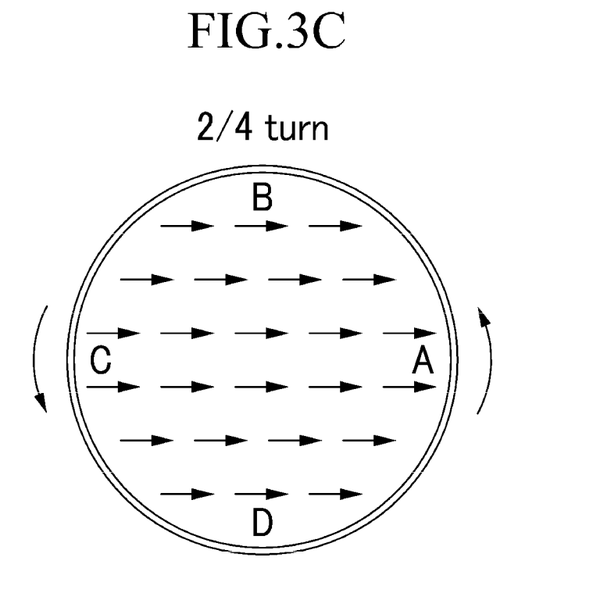

Referring to FIG. 3C, when the substrate is rotated twice, the position C corresponds to the process gas inflow portion and the position A corresponds to the process gas outflow portion in the substrate. Therefore, the flow rate or concentration of the process gas is the highest at the position C, the lowest at the position A, and the middle at the positions D and B in the substrate. A portion (m/4 of the desired thickness 'm') of the thin film is deposited and the substrate is rotated at the initial flow rate and concentration of the process gas.

Figure 3D:
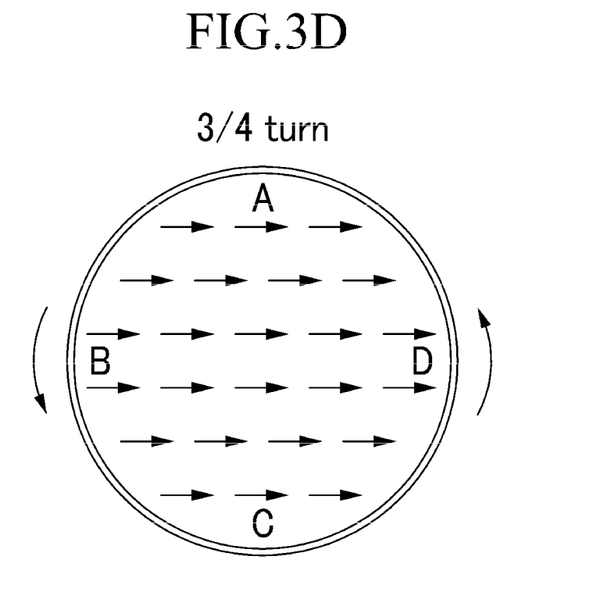

Referring to FIG. 3D, when the substrate is rotated three times, the position B corresponds to the process gas inflow portion and the position D corresponds to the process gas outflow portion in the substrate. Therefore, the flow rate or concentration of the process gas is the highest as the position B, the lowest at the position D, and the middle at the positions C and A in the substrate. A portion (m/4 of the desired thickness 'm') of the thin film is deposited and the substrate is rotated at the initial flow rate and concentration of the process gas.

Figure 3E:
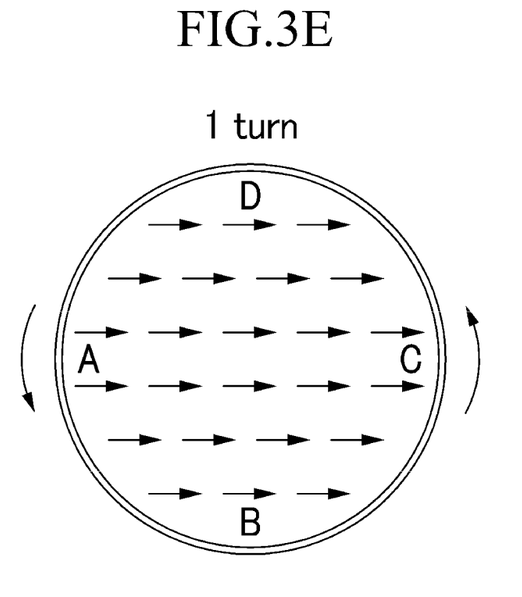

Referring to FIG. 3E, when the substrate is rotated four times, as in the initial state of the thin film deposition process, the position A corresponds to the process gas inflow portion and the position C corresponds to the process gas outflow portion in the substrate.

It is possible to reduce the difference in flow rate or concentration of the process gas depending on the positions on the substrate by repeating these works, such that it is possible to achieve a thin film having a desired thickness 'm' and improved uniformity.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A lateral-flow deposition apparatus in which a process gas flows between a first surface of a reaction chamber where a substrate is disposed and a second surface of the reaction chamber facing the first surface, the process gas flowing in a direction that is substantially in parallel with the substrate, the apparatus comprising:
   a substrate support that moves up/down and rotates the substrate while supporting the substrate;
   a substrate support heater disposed under the substrate support, transferring heat to the substrate support, and moving up/down, wherein the substrate support heater and the substrate support are spaced at a distance from each other;
   a reactor cover that defines the reaction chamber by contacting the substrate support heater;
   a substrate support lifter and a substrate support rotator that move the substrate support; and
   a sub-gas inlet allowing a sub-gas to be injected between the substrate support and the substrate support heater,
   wherein the sub-gas inlet is disposed at a center portion of the substrate support heater.

2. The apparatus of claim 1, wherein:
heat of the substrate support heater is transferred to the substrate support by the sub-gas.

3. The apparatus of claim 1, wherein:
the sub-gas flows to prevent the process gas from flowing under the substrate support.

4. The apparatus of claim 1, further comprising:
a substrate support pin supporting the substrate independently from the substrate support and moving up/down; and
a support pin driver moving up/down the substrate support pin.

5. The apparatus of claim 4, further comprising:
a support pin base connecting the support pin driver with the substrate support pin.

6. The apparatus of claim 1, wherein:
the substrate support rotator rotates the substrate support while the process gas flows on the substrate in the defined reaction chamber without opening the reaction chamber, preventing foreign substances from flowing into the reaction chamber during the rotation of the substrate support.

7. The apparatus of claim 1, wherein:
the substrate support rotator rotates the substrate support by n°, and
the rotation of the substrate support is performed at least (360°/n°) times.

8. The apparatus of claim 1, wherein:
the substrate support is rotated by the substrate support rotator in the defined reaction chamber while the reactor cover contacts the substrate support heater.

9. The apparatus of claim 7, wherein:
a flow rate of the process gas is controlled according to the rotation of the substrate.

10. The apparatus of claim 7, wherein:
a concentration of the process gas is controlled according to the rotation of the substrate.

11. The apparatus of claim 7, wherein:
a flow direction of the process gas is changed with respect to a center of the substrate by the rotation of the substrate support.

12. The apparatus of claim 7, wherein:
a thickness of a thin film deposited on the substrate increases by a predetermined thickness every time when the substrate support is rotated during deposition of the thin film on the substrate.

13. The apparatus of claim 1, wherein:
the sub-gas inlet is disposed around the substrate support lifter.

* * * * *